US007015870B2

(12) United States Patent
Guitton et al.

(10) Patent No.: US 7,015,870 B2
(45) Date of Patent: Mar. 21, 2006

(54) INTEGRATED BI-BAND INDUCTANCE AND APPLICATIONS

(75) Inventors: Fabrice Guitton, Tours (FR); François Dupont, Tours (FR)

(73) Assignee: STMicroelectronics S.A., Montrouge (FR)

( * ) Notice: Subject to any disclaimer, the term of this patent is extended or adjusted under 35 U.S.C. 154(b) by 22 days.

(21) Appl. No.: 10/816,085

(22) Filed: Apr. 1, 2004

(65) Prior Publication Data
US 2004/0251985 A1 Dec. 16, 2004

(30) Foreign Application Priority Data
Apr. 3, 2003 (FR) .................................. 03 04148

(51) Int. Cl.
*H01Q 1/50* (2006.01)

(52) U.S. Cl. ...................................... 343/860; 343/864

(58) Field of Classification Search ................ 343/850, 343/860, 864; 333/126
See application file for complete search history.

(56) References Cited

U.S. PATENT DOCUMENTS

| 2,561,087 | A | * | 7/1951 | Anderson | .................... 455/142 |
| 5,095,285 | A | | 3/1992 | Khatibzadeh | |
| 5,794,134 | A | | 8/1998 | Enoki et al. | |
| 6,011,959 | A | * | 1/2000 | Reeser et al. | .................. 455/76 |
| 6,097,349 | A | * | 8/2000 | Sanford | ...................... 343/859 |
| 6,501,363 | B1 | | 12/2002 | Hwu et al. | |

FOREIGN PATENT DOCUMENTS

DE          100 52 719 A1     5/2002

OTHER PUBLICATIONS

French Search Report from French Patent Application No. 03/04148, filed Apr. 3, 2003.
Wu Y-C et al. "on-Chip High-Q(>3000) transformer-type spiral inductors" Electronics Letters, IEE Stevenage, GB, vol. 38, No. 3, Jan. 31, 2002, pp. 112-113, XP006017805.

* cited by examiner

*Primary Examiner*—Shih-Chao Chen
(74) *Attorney, Agent, or Firm*—Lisa K. Jorgenson; James H. Morris; Wolf, Greenfield & Sacks, P.C.

(57) ABSTRACT

A multi-band inductive circuit in an integrated circuit, including at least two parallel branches respectively including a first inductance and a second inductance in series with a capacitor, the two inductances being coupled to each other.

35 Claims, 3 Drawing Sheets

INTEGRATED BI-BAND INDUCTANCE AND APPLICATIONS

BACKGROUND OF THE INVENTION

1. Field of the Invention

The present invention relates to the field of inductances, and more specifically to the forming of an inductance having its value modified according to the frequency of the signal which is applied thereto.

2. Discussion of the Related Art

An example of application of the present invention relates to radiofrequency transceiver chains, for example, of the type used in bi-band mobile phones, that is, capable of operating on two frequency bands (for example, GSM and DCS).

FIG. 1 very schematically shows in the form of blocks a conventional example of a conventional bi-band radiofrequency transceiver system to which the present invention applies. The architecture of such a system can be described as a receive chain 1 and a transmit chain 2, both connected to an antenna 3.

On receive side 1, two parallel receive paths each providing a signal RX1 or RX2 according to the frequency band at which the signal is received, directed to an interpretation system not shown, generally a digital system, are available. Each path comprises, between a terminal 11 or 12 of connection to antenna 3 via a band selection switch 13:

a band-pass filter 111 (BP 1) or 121 (BP 2) centered on a frequency of the corresponding band;

a low-noise amplifier (LNA) 112, 122; and a mixer 113, 123 of the signal output by the preceding amplifier with a signal provided by a local oscillator OL1, OL2 at the band frequency of the concerned path. The respective outputs of mixers 113 and 123 provide received signals RX1 and RX2.

For a proper operation of receive chain 1, it is necessary to provide, between each component of the chain, an impedance matching element (ZA), generally at 50 ohms. Thus, elements 41 are respectively provided between filter 111 and amplifier 112, between amplifier 112 and mixer 113, and at the output of mixer 113, upstream of the interpretation system of received signals RX1. Similarly, for the second path, impedance matching elements 42 are respectively provided between filter 121 and amplifier 122, between amplifier 122 and mixer 123, and at the output of mixer 123. Elements 41 and 42 differ by the central frequency of the concerned band.

The transmit chain side has substantially the same architecture, that is, each path includes, between the system for providing a signal TX1 or TX2 to be transmitted and a terminal 21 or 22 intended to be connected, by a switch 23, to antenna 3:

a mixer 213, 223 of the signals to be transmitted with a signal provided by a local oscillator OL1, OL2 at the central frequency of the passband of the considered path;

a power amplifier (PA) 212, 222; and a band-pass filter 211 (BP1), 221 (BP2), centered on the central frequency of the passband of the considered path.

As for the receive chain, it is necessary to provide impedance matching elements 41 between amplifier 212, and filter 211, between mixer 213 and amplifier 212 and at the input of mixer 213, and elements 42 between amplifier 222 and filter 221, mixer 223 and amplifier 222, and at the input of mixer 223.

FIG. 2 shows a conventional example of an impedance matching element 4. Such an element is generally formed of two input and output terminals 43 and 44 of element 4, of a capacitor C4, and of an inductance L4. Inductance L4 grounds an electrode of the capacitor (connected to terminal 44). The capacitor and the inductance of elements 4 are sized so that at the work frequency (central frequency of the passband desired for the system), the impedance matching system exhibits on one side the conjugated complex impedance of the circuit to be matched (for example, a transistor), when loaded on the other side with the desired impedance (for example, 50 ohms). Generally, the impedance of the circuit to be matched varies according to frequency. Further, for the same impedance to be matched, the value of the elements varies according to the working frequency.

It can thus be seen that, to form a bi-band transmit or receive chain, the impedance matching elements must be sized differently according to the considered path.

This need for separate impedance matching elements adversely affects the miniaturization of electronic circuits (for example, radiofrequency transceiver chains in the considered example).

In this application, the fact that the impedance matching elements are dedicated to each frequency band requires using separate amplifiers and mixers for each frequency band. This problem is particularly present in the case where the transmit or receive amplifiers are integrated, with no impedance matching element.

More generally, in any bi-band or multi-band application for which an inductive element is sized according to the frequency of the concerned band and cannot adapt to the frequency of another band, a bulk problem arises for the electronic circuit due to the necessary size of the inductive elements. This problem is particularly present for the forming of inductive elements in an integrated circuit formed of planar windings on a surface of an integrated circuit or of any substrate.

SUMMARY OF THE INVENTION

The present invention aims at overcoming the disadvantages of known solutions using separate inductive circuits to operate on two frequency bands.

More specifically, the present invention aims at providing the forming of an inductive circuit capable of operating on at least two frequency bands.

The present invention also aims at simplifying the forming of such an inductive element in the form of an integrated circuit.

The present invention also aims at providing a solution which is particularly well adapted to the forming of a bi-band resonator element.

The present invention also aims at providing a solution which is particularly well adapted to the forming of a bi-band impedance matching element.

The present invention also aims at providing a novel architecture of a bi-band radiofrequency transmit or receive chain.

To achieve these and other objects, the present invention provides a multi-band inductive circuit in an integrated circuit, forming a dipole and comprising at least two parallel branches respectively comprising a first inductance and a second inductance in series with a capacitor, the two inductances being coupled to each other.

According to an embodiment of the present invention, n parallel branches each comprise an inductance, n−1 of these branches further comprising a series capacitor, to form an inductive elements with n bands.

According to an embodiment of the present invention, the inductances are formed by superposed planar conductive windings.

According to an embodiment of the present invention, the value of the first inductance is selected to approximately correspond to a first cut-off frequency or to the central frequency of a first impedance matching band, desired for the inductive element.

According to an embodiment of the present invention, the second inductance is selected to approximately correspond to a value such that the equivalent inductance of the two elements in parallel corresponds to the value desired for a second cut-off frequency or for the central frequency of a second impedance matching band of the inductive element.

According to an embodiment of the present invention, the value of the capacitor is selected according to a resonance frequency desired for the inductive element.

According to an embodiment of the present invention, the capacitor is variable, to form a programmable filter.

The present invention also provides an impedance matching circuit comprising a multi-band inductive element and at least one capacitor and/or inductance.

The present invention also provides a resonator comprising a multi-band inductive element connected between a first electrode of a capacitor having its second electrode connected to a transmit line and the ground.

The present invention also provides a multi-band radiofrequency transceiver chain.

The foregoing objects, features, and advantages of the present invention will be discussed in detail in the following non-limiting description of specific embodiments in connection with the accompanying drawings.

DETAILED DESCRIPTION

Figure 1:
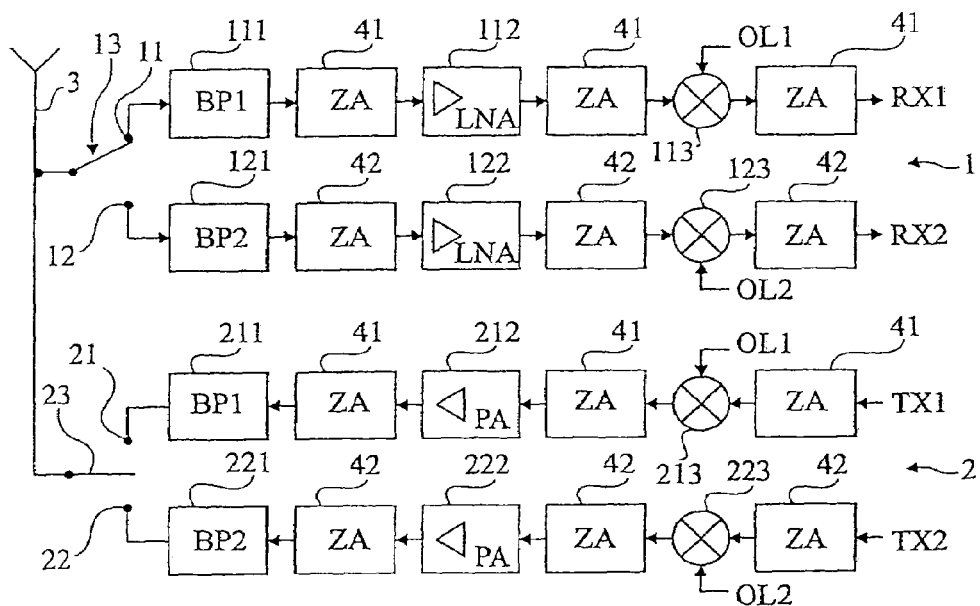
FIG. 1, previously described, shows an example of a conventional bi-band radiofrequency transceiver chain.

The same elements have been referred to with the same reference numerals in the different drawings. For clarity, only those elements that are necessary to the understanding of the present invention have been shown in the drawings and will be described hereafter. In particular, elements of the radiofrequency transceiver chains other than the impedance matching elements specific to the present invention have not been described in detail.

A feature of the present invention is to provide a passive electronic circuit forming a dipole and performing the function of a bi-band impedance by means of two parallel coupled inductive elements and of a capacitor. More generally, the present invention provides forming of an n-band impedance by means of n coupled inductive elements and of n−1 capacitors.

Figure 3:
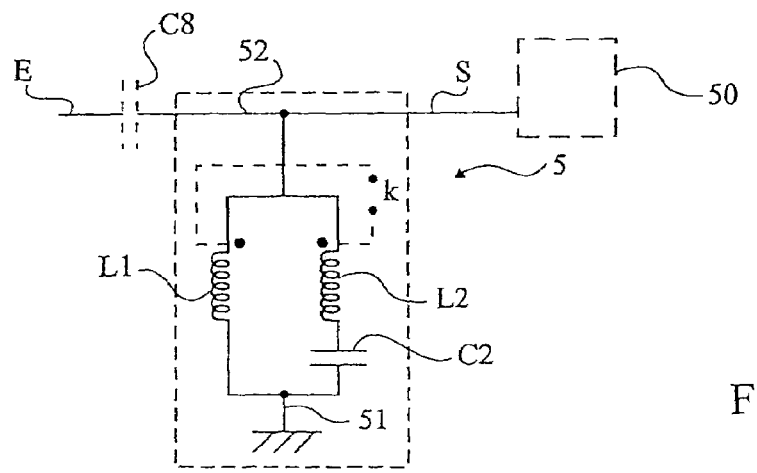
FIG. 3 shows the electric diagram of a bi-band inductance according to an embodiment of the present invention.

FIG. 3 shows the electric diagram of a bi-band inductive element 5 according to the present invention. Such an element can be connected in series on a transmit line or between a transmit line and a reference voltage. In the example shown, element 5 has a terminal 51 connected to a reference voltage (generally, the ground). In the example of FIG. 3, the transmit line may be considered as input/output terminals E, S of inductive element 5. It should be noted that the input/output terminals are then not directional.

As illustrated in FIG. 3, the bi-band bi-directional element of the present invention comprises a first inductance L1 connecting terminals 52 and 51 of the formed dipole, in parallel with a series connection of a second inductance L2 and of a capacitor C2. Inductance L2 and capacitor C2 form a series resonant circuit. Preferably, inductances L1 and L2 are coupled to each other. This embodiment has been illustrated by dotted lines and the specification of a coupling coefficient k.

An inductive element 5 according to the present invention is sized for a resonance frequency approximately selected between the two operating frequencies desired for the bi-band inductance. "Operating frequency" means the central frequency of each of the passbands of the inductive element, or the two cut-off frequencies if this element is assembled as a resonator as will be illustrated hereafter.

For a very low operating frequency as compared to the resonance frequency of assembly L2, C2, equivalent inductance Leq of element 5 approximately corresponds to the value of inductance L1. For an operating frequency much greater than the resonance frequency, the equivalent inductance approximately corresponds to the parallel association of inductances L1 and L2. This without taking coupling k into account. Taking coupling k into account, the equivalent inductance corresponds to the putting in parallel of an inductance of value L1+kL2 with an inductance of value L2+kL1.

Preferably, inductances L1 and L2 have the same value.

Figure 4:
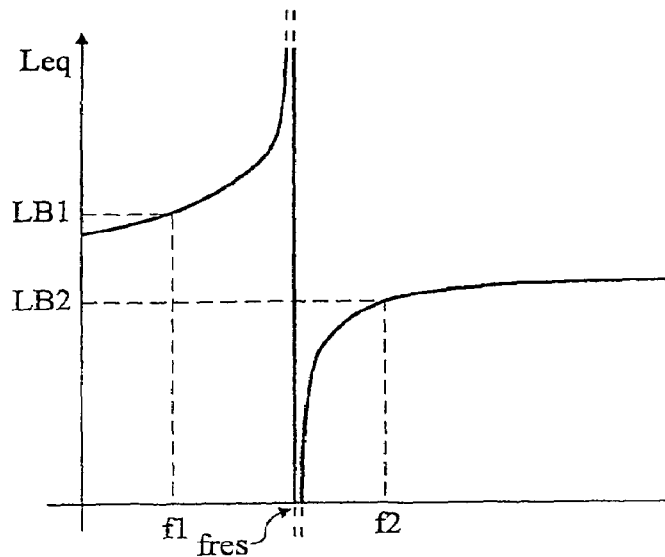
FIG. 4 shows the inductance-vs.-frequency characteristic of the element of FIG. 3.

FIG. 4 illustrates the characteristic of equivalent inductance Leq of element 5 of FIG. 3 according to frequency f. For a first frequency f1 of the inductive element, said element exhibits a value LB1 greater than a second value LB2 that it reaches at a frequency f2, frequencies f1 and f2 being around resonance frequency fres of the element. As will be seen hereafter in relation with FIGS. 6 and 8, frequencies f1 and f2 respectively correspond to impedance matching frequencies or to rejection frequencies. This phenomenon does not appear in FIG. 4 that only illustrates the variation of the equivalent inductance value.

The sizing of an inductive element 5 according to the present invention is performed, for example, as follows.

The value of inductance L1 is first selected to approximately correspond to the inductance value desired for first operating frequency f1 of inductive element 5. This determination amounts to the conventional determination of an inductive element for a given application. For example, for a conventional impedance matching circuit (FIG. 2), it is known to determine the inductance L4 desired for the operating frequency of the concerned path.

The approximate value of inductance L2 is then determined so that the equivalent inductance of elements L1 and L2 in parallel corresponds to the inductance desired for operating frequency f2. Here again, the desired inductance value for the second frequency is a function of the application and is conventionally determined. The value of inductance L2 is thus selected by applying the following formula:

$$L2 = Leq.L1/(L1-Leq).$$

The value of capacitor C2 is then selected according to the resonance frequency. As indicated previously, the resonance frequency is approximately determined as being between the two operating frequencies f1 and f2 desired for the bi-band inductive element (fres=(f1+f2)/2).

In fact, with a coupling k between inductances L1 and L2, resonance frequency fres is approximately given by the following relation:

$$fres \approx \frac{1}{2 \cdot \pi \cdot \sqrt{(L2 - kL1 + L1 - kL2) \cdot C2}}.$$

For coupling k, a value for example chosen between 0.5 and 0.8 is taken.

After having approximately evaluated the values to be given to elements L1, L2, and C2 of the inductive element, said element is optimized according to the application by using well known simulation tools usual in the forming of electronic circuits.

To use the element of FIG. 3 in an impedance matching circuit of a circuit (dotted lines 50) connected to terminal S, a capacitor (dotted lines C8) is generally provided at the input (between terminal 52 and terminal E).

Figure 5:
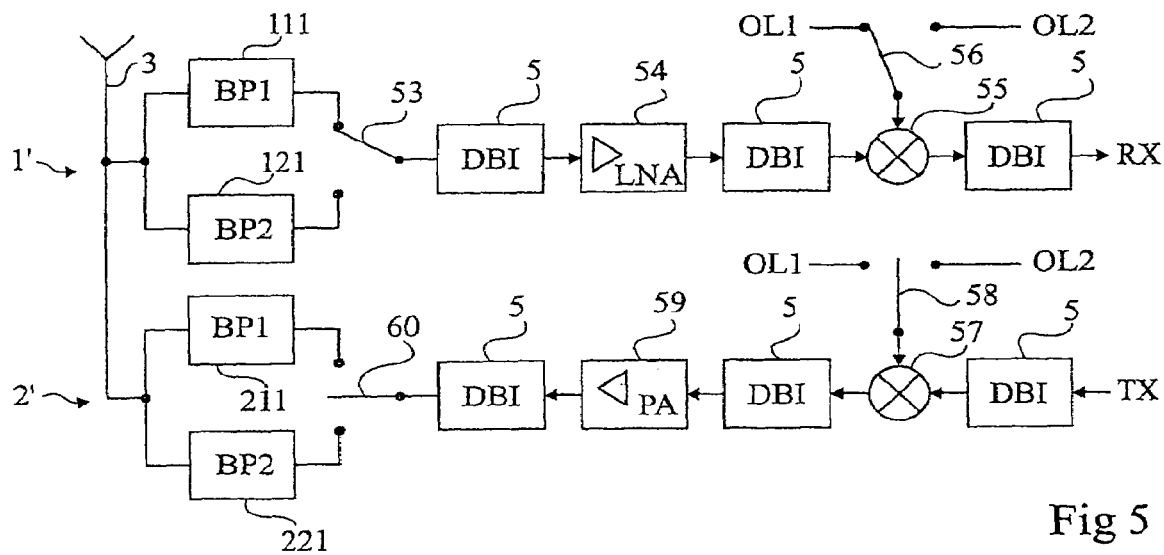
FIG. 5 very schematically shows in the form of blocks a bi-band radiofrequency transceiver chain according to an embodiment of the present invention.

FIG. 5 shows an embodiment of a bi-band radiofrequency transceiver chain according to the present invention.

As previously, receive and transmit paths 1' and 2' are connected by one end to an antenna 3, and their other respective ends are connected to a system for exploiting received data RX and data to be transmitted TX.

According to the present invention, impedance matching elements 5 (DBI) are formed of bi-band elements such as illustrated in relation with FIG. 3. Due to the use of bi-band elements, it is now possible to share, for each path (transmit, receive), the same amplifier and the same mixer. Thus, receive path 1' comprises two band-pass filters 111 (BP1) and 121 (BP2) in parallel between antenna 3 and a passband selection switch 53. Downstream, switch 53 is connected to a single low-noise amplifier (LNA) 54 via a bi-band impedance matching element 5. The output of amplifier 54 is connected to a single mixer 55 via another bi-band impedance matching element 5. Similarly, the output of mixer element 55 is connected to an element 5. The second input of mixer 55 is connected to two terminals for receiving the frequencies of oscillators OL1 and OL2 by a switch 56 to select, at the same time as the band-pass filter of the concerned band, the frequency of the mixer's local oscillator.

On the transmit chain side, a single mixer 57 surrounded with two impedance matching elements 5 and having its local oscillator input connected by a switch 58 to two terminals of application of local oscillator frequencies OL1 and OL2 can be found. A single transmit amplifier 59 (PA) receives the signal from mixer 57 after crossing of an impedance matching element 5, and is connected by an impedance matching element 5 to a switch 60 of selection between a band-pass filter 211 (BP1) and a band-pass filter 221 (BP2) to select the passband of the transmit chain.

According to the structure of the band-pass filters, selection switches may also be provided on the side of antenna 3 to completely isolate the unused filters.

Figure 6:
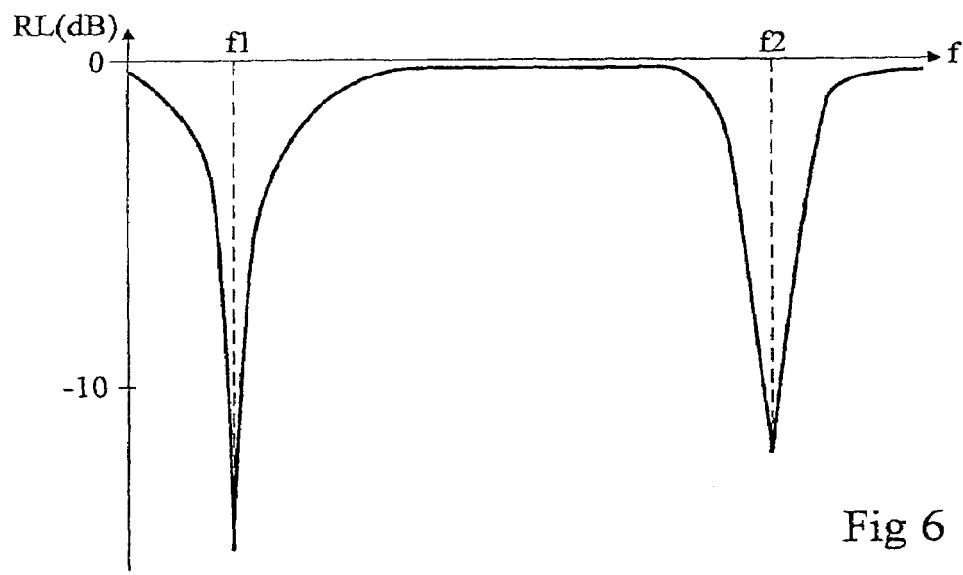
FIG. 6 shows the impedance matching-vs.-frequency characteristic of a bi-band impedance matching element of the circuit of FIG. 5.

FIG. 6 shows the impedance matching-vs.-frequency characteristic of impedance matching elements 5 of the radiofrequency transceiver chain architecture of FIG. 5. These elements are sized to have a first return cut-off frequency f1 corresponding to the central frequency of the first passband (BP1) and a second return cut-off frequency f2 corresponding to the central frequency of second passband BP2. In the example of application to mobile telephony for the GSM and DCS bands, frequencies f1 and f2 are respectively 900 MHz and 1800 MHz.

The impedance matching especially characterizes, as illustrated in FIG. 6, by return losses RL that correspond, according to frequency, to the ratio between the power reflected on a port and the power output by said port.

According to the example of application to mobile telephony, a circuit to be adapted connected to terminal S (FIG. 3) and exhibiting, at 900 MHz, an impedance of 39 ohms −j151 ohms (j designating the imaginary part of a complex number) and, at 1800 MHz, a complex impedance of 16 ohms −j78 ohms, may be matched to 50 ohms for the two frequencies, with a bi-band inductance in conformity with the embodiment of FIG. 3, with the following values: inductances L1 and L2 of same value (7.4 nanohenries) coupled with a 0.7 coefficient; capacitance C2 of 2.21 picofarads and capacitance C8 of 850 femtofarads. The impedance seen from terminal E then is 50 ohms for the two 900 MHz and 1.8 GHz frequencies. With such a matching circuit, reflection losses of respectively from −14 dB at 900 MHz and from −13 dB at 1.8 GHz are obtained (FIG. 6).

Figure 7:
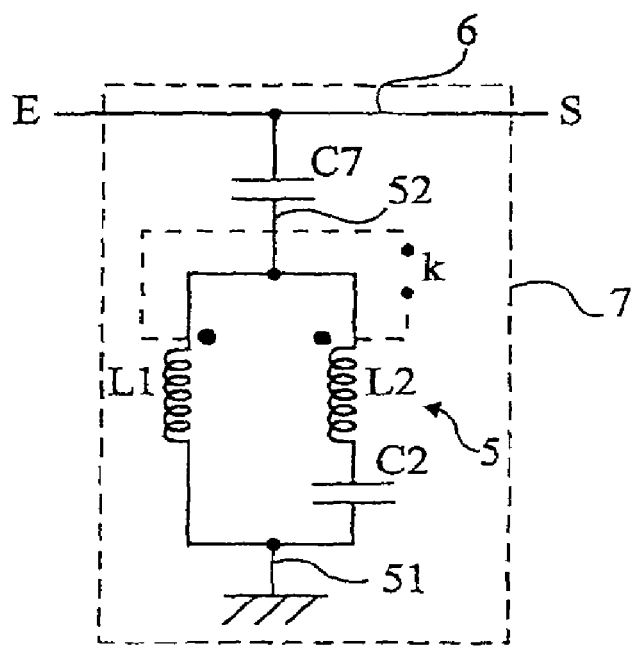
FIG. 7 shows the diagram of a bi-band resonator according to an embodiment of the present invention.

FIG. 7 illustrates a second application of the present invention to the forming of a bi-band resonator. Resonator circuit 7 shown in FIG. 7 comprises a bi-band inductive element of the type shown in FIG. 3, having its terminal 52 opposite to ground 51 connected, by a capacitor C7, to a transmit line symbolized by input/output E and S of resonator element 7.

Figure 8:
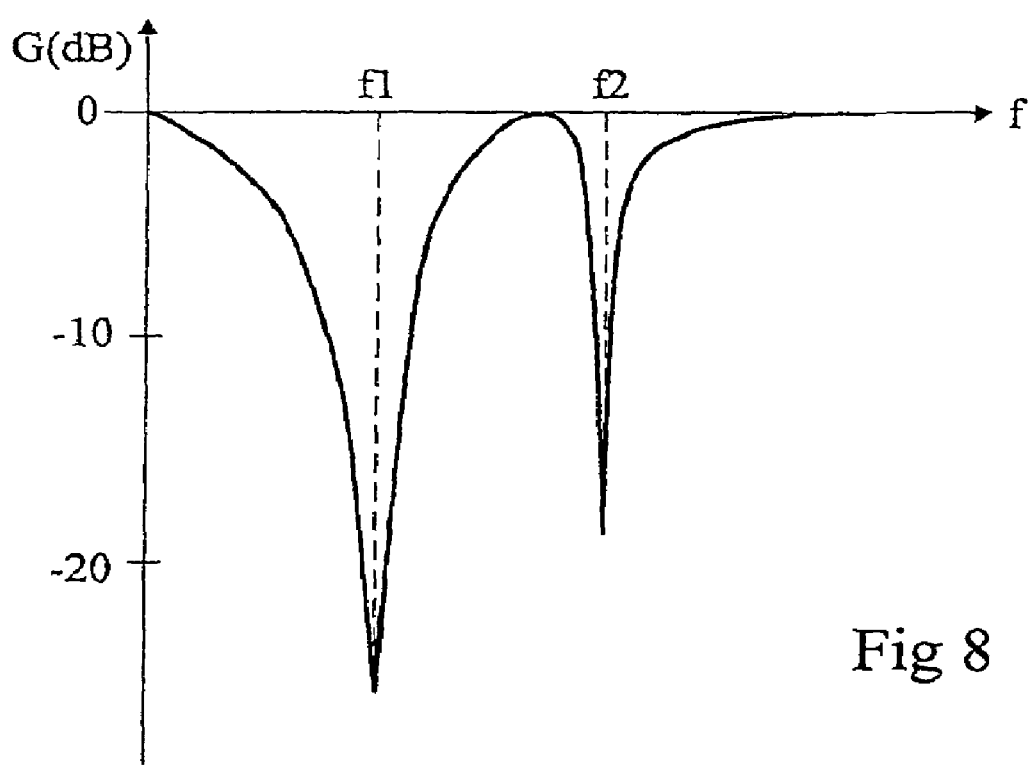
FIG. 8 illustrates the gain-vs.-frequency characteristic of the resonator of FIG. 7.

FIG. 8 illustrates the response gain-vs.-frequency characteristic of the resonator element of FIG. 7. Said element has two cut-off frequencies f1 and f2 for which the attenuation is on the order of at least −20 dB. In the example of application to frequencies other than those of GSM (900 MHz) and DCS (1.8 GHz) mobile telephony, for example, the WCDMA, WLAN, or Bluetooth standards, a bi-band inductive element with components such as those described previously in relation with FIG. 3 and with a capacitor C7 having a 3.5-picofarad value may be used. A resonator having respective attenuations of −27 and −18 dB at the 900-MHz and 1.8-GHz frequencies is then obtained. GSM and DCS frequencies are thus rejected.

A resonator such as illustrated in FIG. 7 may, for example, be used as a complement of the band-pass filters of a radiofrequency transceiver chain (on the side of antenna 3) to improve the filter response. More specifically, such complementary resonators enable reducing the order of the necessary filters.

An advantage of the present invention is that it enables forming a bi-band impedance of reduced bulk. Indeed, inductances L1 and L2 can be formed in an integrated circuit by superposing the two inductive windings due to the desired coupling k between these two inductances. Accordingly, the necessary bulk is divided by at least two with respect to the forming of two conventional impedance matching elements (FIG. 1). Further, an induced advantage of the present invention is that it enables then sharing other circuit elements, for example, the mixers and amplifiers of the radiofrequency transmit chains, which further reduces the circuit bulk.

According to another example of application of the present invention, the bi-band inductive element may be turned into a programmable filter by providing a capacitor C2 (FIG. 3), C7 (FIG. 7), or again the input capacitance of a variable matching circuit (C8, FIG. 3) (for example, a varicap or the like). Such a modification is within the abilities of those skilled in the art based on the functional indications given hereabove.

Of course, the present invention is likely to have various alterations, modifications, and improvements which will readily occur to those skilled in the art. In particular, the dimensions to be given to the inductive and capacitive elements of the bi-band inductive element of the present invention depend on the application and may be determined with conventional optimization tools based on approximate values determined as indicated in the present description.

Further, although the present invention has been described with a specific application to GSM and DCS bi-band mobile telephony, it readily applies to other frequency bands.

Further, the present invention is not limited to a bi-band inductance, but may be implemented to form a multi-band inductance taking different values at different frequencies. As many parallel inductances (for example, n) as there are work frequencies or desired bands (n) are provided, with a capacitor in series with each inductance but one (n−1 capacitors). All inductances are coupled two by two. The sizing to be provided for the different elements can be derived from the above discussion in relation with a bi-band inductance.

Figure 2:
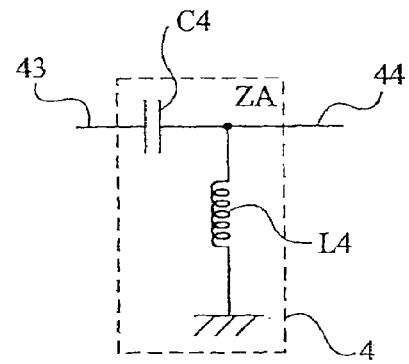
FIG. 2, previously described, shows an example of an impedance matching element.

Finally, in the application to an impedance matching circuit, the bi- or multi-band inductance of the present invention may be used in other diagrams than that of FIG. 2 using a series capacitor on the transmit line and where the inductance of the present invention (FIG. 3) replaces the usual single-band inductance. For example, a bi- or multi-band inductance according to the present invention may be associated with other inductances or capacitors in a series or parallel configuration.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A multi-band inductive circuit in an integrated circuit, forming a dipole and comprising at least two parallel branches, one of the at least two parallel branches comprising a first inductance and another of the at least two parallel branches comprising a second inductance in series with a capacitor, the two inductances being coupled to each other.

2. The multi-band inductive circuit of claim 1, wherein a first number of parallel branches each comprise an inductance, one less than the first number of these branches further comprising a series capacitor, so that the multi-band inductive circuit is operative to handle the first number of bands.

3. The multi-band inductive circuit of claim 1, wherein the inductances are formed by superposed planar conductive windings.

4. The multi-band inductive circuit of claim 1, wherein a value of the first inductance is selected to approximately correspond to a first cut-off frequency or to a central frequency of a first impedance matching band, desired for the multi-band inductive circuit.

5. The multi-band inductive circuit of claim 4, wherein a value of the second inductance is selected to approximately correspond to a value such that an equivalent inductance of the two branches in parallel corresponds to a value desired for a second cut-off frequency or for a central frequency of a second impedance matching band of the multi-band inductive circuit.

6. The multi-band inductive circuit of claim 4, wherein a value of the capacitor is selected according to a resonance frequency desired for the multi-band inductive circuit.

7. The multi-band inductive circuit of claim 6, wherein the capacitor is variable, to form a programmable filter.

8. A multi-band impedance matching circuit, comprising the multi-band inductive circuit of claim 1, and at least one capacitor and/or inductance.

9. A multi-band resonator, comprising the multi-band inductive circuit of claim 1 connected between a first electrode of a capacitor having its second electrode connected to a transmit line and the ground.

10. A multi-band radiofrequency transceiver chain, comprising a multi-band impedance matching circuit, the multi-band impedance matching circuit comprising:
a multi-band inductive circuit in an integrated circuit, forming a dipole and comprising at least two parallel branches, one of the at least two parallel branches comprising a first inductance and another of the at least two parallel branches comprising a second inductance in series with a capacitor, the two inductances being coupled to each other; and
at least one capacitor and/or inductance.

11. A circuit for transmitting and/or receiving electromagnetic signals comprising an inductive circuit, the inductive circuit comprising:
a first inductive element; and
a second inductive element electromagnetically coupled to the first inductive element and connected in series to a capacitive element, wherein the series connection of the second inductive element and the capacitive element is connected in parallel to the first inductive element.

12. The circuit of claim 11, wherein the inductive circuit is operative for multiple operating frequencies.

13. The circuit of claim 12, wherein the inductive circuit is operative for only two operating frequencies, and
wherein the inductive circuit is sized to have a resonance frequency value between the values of the two operating frequencies.

14. The circuit of claim 13, wherein the circuit is operative for two passbands, and
wherein each of the two operating frequencies is a respective central frequency of one of the passbands.

15. The circuit of claim 11, wherein the circuit is an integrated circuit.

16. The circuit of claim 11, wherein the second inductive element and the capacitive element form a series resonance circuit.

17. The circuit of claim 1, wherein the inductive circuit forms a dipole.

18. The circuit of claim 11, wherein the inductive circuit is an impedance matching circuit.

19. The circuit of claim 11, wherein the circuit is a resonator.

20. The circuit of claim 11, wherein the circuit is a multi-band radiofrequency transceiver chain.

21. The circuit of claim 20, wherein the multi-band radiofrequency transceiver chain comprises a transmit chain and a receive chain, the transmit chain and/or the receive chain comprising only a single mixer to mix a signal provided by an oscillator and a signal received by the receive chain or to be transmitted from the transmit chain.

22. The circuit of claim 21, wherein the transmit chain and/or the receive chain of the multi-band radiofrequency transceiver chain comprises only a single amplifier to amplify a signal received by the receive chain or to be transmitted from the transmit chain.

23. The circuit of claim 22, wherein the multi-band radiofrequency transceiver chain is connected to an antenna and is operative for two central frequencies of respective passbands, the transmit chain and/or the receive chain of the multi-band radiofrequency transceiver chain further comprising:

two bandpass filters, each having a first node connected to the antenna and a second node;

a switch to selectively connect one of the second nodes of the two bandpass filters to a first node of the inductive circuit, wherein a second node of the inductive circuit is connected to a first node of the amplifier;

another inductive circuit comprising a first inductive element and a second inductive element electromagnetically coupled to the first inductive element and connected in series to a capacitive element, wherein the series connection of the second inductive element and the capacitive element is connected in parallel to the first inductive element, a first node of the other inductive circuit connected to a second node of the amplifier, and a second node of the other inductive circuit connected to a node of the mixer.

24. The circuit of claim 11, wherein the first inductive element is sized to have an inductance value desired for a first operating frequency of the inductive circuit, and wherein the second inductive element is sized so that an equivalent inductance of the first and second inductive elements has a value desired for a second operating frequency of the inductive circuit.

25. The circuit of claim 24, wherein the capacitive element is sized to have a capacitance value desired to produce a particular resonant frequency of the inductive circuit.

26. A multi-band radiofrequency transceiver chain comprising a transmit chain, the transmit chain comprising:

a plurality of bandpass filters, each bandpass filter having an input node and an output node to provide an output signal of the transmit chain, and each bandpass filter corresponding to a different operating frequency;

a single transmit path having an input node serving as an input of the transmit chain and having an output node to provide a signal as input to the input node of one of the bandpass filters; and means for propagating signals from the input node of the single transmit path to the output node of the single transmit path at each of the plurality of different operating frequencies.

27. The multi-band radiofrequency transceiver chain of claim 26, wherein the transmit chain further comprises:

a switch to selectively connect the output node of the single transmit path to the input node of one of the bandpass filters.

28. The multi-band radiofrequency transceiver chain of claim 26, wherein the single transmit path comprises a single mixer connected in series with a single amplifier.

29. The multi-band radiofrequency transceiver chain of claim 28, wherein the single mixer is operative to mix an input signal received at the input node of the single transmit path and a signal provided by an oscillator to produce a mixed signal.

30. The multi-band radiofrequency transceiver chain of claim 29, wherein the single amplifier is operative to amplify the mixed signal.

31. A multi-band radiofrequency transceiver chain comprising a receive chain, the receive chain comprising:

a plurality of bandpass filters, each bandpass filter having an output node and an input node to receive an input signal of the receive chain, and each bandpass filter corresponding to a different operating frequency;

a single receive path having an output node serving as an output of the receive chain and having an input node to receive as input a signal output from the output node of one of the bandpass filters; and means for propagating signals from the input node of the single receive path to the output node of the single receive path at each of the plurality of different operating frequencies.

32. The multi-band radiofrequency transceiver chain of claim 31, wherein the receive chain further comprises:

a switch to selectively connect the output node of one of the bandpass filters to the input node of the single receive path.

33. The multi-band radiofrequency transceiver chain of claim 31, wherein the single receive path comprises a single amplifier connected in series with a single mixer.

34. The multi-band radiofrequency transceiver chain of claim 31, wherein the single amplifier is operative to amplify the signal received from the output node of one of the bandpass filters to produce an amplified signal.

35. The multi-band radiofrequency transceiver chain of claim 31, wherein the single mixer is operative to mix the amplified signal and a signal provided by an oscillator to produce a mixed signal.

* * * * *